(12) United States Patent
Power et al.

(10) Patent No.: US 8,101,492 B2
(45) Date of Patent: Jan. 24, 2012

(54) METHOD FOR MAKING SEMICONDUCTOR DEVICE

(75) Inventors: John Power, Dresden (DE); Danny Pak-Chum Shum, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 126 days.

(21) Appl. No.: 12/565,454

(22) Filed: Sep. 23, 2009

(65) Prior Publication Data

US 2011/0070725 A1 Mar. 24, 2011

(51) Int. Cl.
*H01L 21/331* (2006.01)

(52) U.S. Cl. ........ 438/347; 438/238; 438/381; 438/510; 257/E21.006; 257/E21.042; 257/E21.043; 257/E21.17; 257/E21.32; 257/E21.218; 257/E21.229; 257/E21.304; 257/E21.248; 257/E21.267; 257/E21.278; 257/E21.293; 257/E21.645

(58) Field of Classification Search ............... 438/238, 438/381, 347, 510, 514, 535, 622, 680, 692, 438/706, 712, 752, 753, 789, 790, 954; 257/E21.006, 42, 43, 17, 32, 218, 229, 304, 257/248, 267, 278, 293, 645
See application file for complete search history.

(56) References Cited

U.S. PATENT DOCUMENTS

| | | | |
|---|---|---|---|
| 4,794,565 A | 12/1988 | Wu et al. | |
| 5,073,513 A | 12/1991 | Lee | |
| 6,291,297 B1 | 9/2001 | Chen | |
| 6,784,476 B2 * | 8/2004 | Kim et al. | 257/296 |
| 7,646,054 B2 * | 1/2010 | Mokhlesi | 257/315 |
| 2006/0166420 A1 | 7/2006 | Van Duuren et al. | |
| 2009/0309149 A1 * | 12/2009 | Nirschl et al. | 257/315 |

* cited by examiner

*Primary Examiner* — David Nhu

(74) *Attorney, Agent, or Firm* — Infineon Technologies; Philip Schlazer

(57) ABSTRACT

One or more embodiments relate to a method of forming a semiconductor device, including: providing a substrate; forming a gate stack over the substrate, the gate stack including a control gate over a charge storage layer; forming a conductive layer over the gate stack; etching the conductive layer to remove a portion of the conductive layer; and forming a select gate, the forming the select gate comprising etching a remaining portion of the conductive layer.

40 Claims, 6 Drawing Sheets

METHOD FOR MAKING SEMICONDUCTOR DEVICE

FIELD OF THE INVENTION

Generally, the present invention relates to semiconductor devices and methods of making semiconductor devices.

BACKGROUND OF THE INVENTION

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

One type of semiconductor device is a memory device, in which data is typically stored as a logical "1" or "0". One type of memory device is a charge storage memory device. An example of a charge storage memory device is a floating gate device. Another example of a charge storage memory device is a charge trapping device. In this case, the floating gate may be replaced with charge trapping materials.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
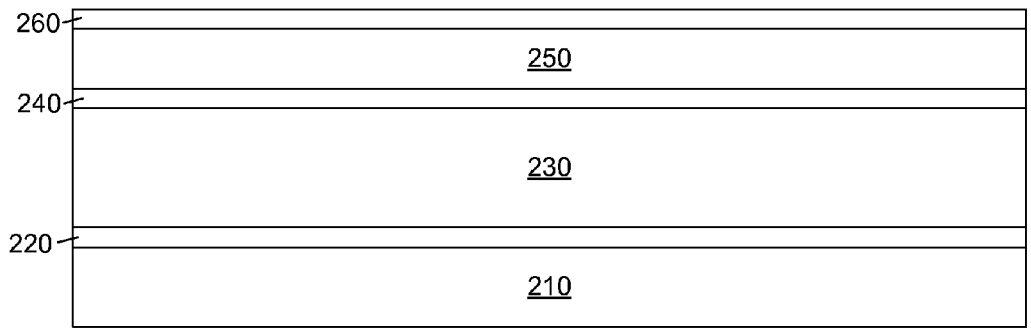
FIGS. 1 through 14 show methods for making a semiconductor device in accordance with embodiments of the present invention.

Referring to FIG. 1, a substrate 210 is provided. The substrate 210 may be any type of substrate. The substrate 210 may be a semiconductor substrate. The substrate 210 may be a silicon substrate (for example, a bulk silicon substrate). In an embodiment, the substrate 210 may be a p-type substrate. The substrate may be a bulk mono-crystalline silicon substrate (or a layer grown thereon or otherwise formed therein), a layer of (110) silicon on a (100) silicon wafer, a silicon-on-insulator (SOI) substrate. The SOI substrate may, for example, be formed by a SIMOX process or, for example, by wafer bonding followed by the removal of excess silicon from one of the wafers. The substrate may be a silicon-on-sapphire (SOS) substrate. The substrate may be a germanium-on-insulator (GeOI) substrate. The substrate may include one or more materials such as semiconductor materials such as silicon germanium, germanium, germanium arsenide, indium arsenide, indium arsenide, indium gallium arsenide, or indium antimonide.

Next, a first dielectric layer 220 is formed over the substrate 210. In one or more embodiments, the first dielectric layer 220 may comprise an oxide (such as silicon dioxide $SiO_2$), a nitride (such as silicon nitride, $Si_3N_4$ or $Si_xN_y$), an oxynitride (such as silicon oxynitride, S—O—N or $SiO_xN_y$), or combinations thereof. The first dielectric layer 220 may comprise two or more layers (e.g. sub-layers). The two or more layers may be arranged as a layered stack. The first dielectric layer 220 may comprise, for example, an oxide/nitride stack such as a $SiO_2/Si_xN_y$ stack (where the layers may be in any order), an oxide/nitride/oxide stack (for example, an ONO stack) or combinations thereof.

In one or more embodiments, the first dielectric layer 220 may comprise a high-k dielectric material. The high-k material may have a dielectric constant greater than 3.9. The high-k material may have a dielectric constant greater than silicon dioxide. The high-k material may comprise a hafnium-based material. The high-k material may comprise one or more of the elements Hf, Al, Si, Zr, O, N, Ta, La, Ti, Y, Pr, Gd and combinations thereof. The high-k material may comprise HfSiON, HfSiO, $HfO_2$, $HfSiO_x$, $HfAlO_x$, $HfAlO_xN_y$, $HfSiAlO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAlO_x$, $SiAlO_xN_y$, $ZrSiAlO_x$, $ZrSiAlO_xN_y$, or combinations thereof. The high-k material may comprise $Al_2O_3$. In one or more embodiments, the first dielectric layer 220 may comprise any other dielectric material or high-k dielectric material. In one or more embodiments, the first dielectric layer 220 may comprise an oxide/high-k stack such as a $SiO_2/Al_2O_3$ stack.

In one or more embodiments, the first dielectric layer 220 may have a thickness of at least 4 nm (nanometers). In one or more embodiments, the first dielectric layer 220 may have a thickness of at least 6 nm. In one or more embodiments, the first dielectric layer 220 may have a thickness of at least 8 nm. In one or more embodiments, the first dielectric layer 220 may have a thickness of less than about 15 nm. In one or more embodiments, the first dielectric layer 220 may have a thickness of less than about 12 nm. In one or more embodiments, the first dielectric layer 220 may comprise a single layer of material or it may comprise two or more layers of material.

The first dielectric layer 220 may be formed in many different ways. For example, the first dielectric layer 220 may be grown by a thermal oxidation, deposited by a chemical vapor deposition (CVD), atomic layer deposition (ALD), physical vapor deposition (PVD), or a jet vapor deposition. Hence, the first dielectric layer 220 may be formed by a growth process or by a deposition process.

A high-k material may be formed, for example, by a deposition process. Examples of deposition processes which may be used include chemical vapor deposition (CVD), physical vapor deposition (PVD), atomic layer deposition (ALD), molecular beam epitaxy (MBE), or other deposition processes.

In one or more embodiments, the first dielectric layer 220 may serve as a tunneling dielectric layer for a floating gate memory device. In another embodiment of the invention, the first dielectric layer 220 may serve as a tunneling dielectric layer for a charge trapping memory device.

In a subsequent processing step, a charge storage layer 230 may be formed over the first dielectric layer 220. In one or more embodiments, the charge storage layer 230 may comprise, for example, a polysilicon material. The polysilicon may be doped with an n-type dopant (such as phosphorus) or a p-type dopant (such as boron). The doping may be accomplished using an ion implantation process or it may be done in-situ. In one or more embodiments, in situ doping involves the addition of dopant gases such as phosphine and diborane to the CVD reactant gases used in polysilicon deposition.

In one or more embodiments, the charge storage layer 230 may comprise any conductive material. In one or more embodiments, the charge storage layer 230 may comprise a metallic material such as a pure metal or a metal alloy. In one or more embodiments, the charge storage layer 230 may comprise a semiconductor material. In one or more embodiments, it is possible that the charge storage layer 230 may comprise a dielectric material. In one or more embodiments, the charge storage layer 230 may comprise a metal silicide or a metal nitride.

In one or more embodiments, the charge storage layer 230 may comprise TiN, TiC, HfN, TaN, TaC, TaN, W, Al, Ru, RuTa, TaSiN, NiSix, CoSix, TiSi$_x$, Ir, Y, Pt, I, Pt, Ti, Pd, Re, Rh, borides of Ti, borides of Hf, borides of Zr, phosphides of Ti, phosphide of Hf, phosphides of Zr, antimonides of Ti, antimonides of Hf, antimonides of Zr, TiAlN, Mo, MoN, ZrSiN, ZrN, HfN, HfSiN, WN, Ni, Pr, VN, TiW, and/or combinations thereof.

In one or more embodiments, the charge storage layer 230 may comprise a nitride. In one or more embodiments, the charge storage layer 230 may comprise a nanocrystalline material. In one or more embodiments, the charge storage layer 230 may comprise a high-k dielectric material.

The charge storage layer 230 may comprise a single layer or a plurality of stacked layers (such as a polysilicon layer disposed over a metal layer). In one or more embodiments, the thickness of the charge storage layer 230 may be about 30 nm to about 300 nm, however, other thicknesses are also possible. The charge storage layer 230 may be deposited in many different ways.

Examples include chemical vapor deposition, physical vapor deposition and atomic layer deposition. In one or more embodiments, the charge storage layer 230 may be a mixture (such as a heterogeneous mixture) of two or more different materials.

In one or more embodiments, the charge storage layer 230 may serve as floating gate layer of a floating gate device. In one or more embodiments, the charge storage layer 230 may serve as a charge trapping layer for a charge trapping device. In one or more embodiments, it is possible that any of the materials described above for the charge storage layer 230 may be useful for either a floating gate layer for a floating gate device or as a charge trapping layer for a charge trapping device.

In one or more embodiments, the charge storage layer 230 may serve as a floating gate layer of a floating gate memory device. Hence, the charge storage layer 230 may include any material that can serve as a floating gate for a floating gate memory device.

In one or more embodiments, the floating gate material may comprise, a polysilicon material. The polysilicon material may be polysilicon. The polysilicon may be doped with an n-type dopant (such as phosphorus) or a p-type dopant (such as boron). The doping may be accomplished using an ion implantation process or it may be done in-situ. As noted above, in situ doping may involve the addition of dopant gases such as phosphine and diborane to the CVD reactant gases used in polysilicon deposition.

In one or more embodiments, the floating gate material may comprise any conductive material. In one or more embodiments, the floating gate material may comprise a metallic material such as a pure metal or a metal alloy. In one or more embodiments, the floating gate material may comprise a semiconductor material. In one or more embodiments, it is possible that the floating gate material may comprise a dielectric material. In one or more embodiments, the floating gate material may comprise a metal silicide or a metal nitride.

In one or more embodiments, the floating gate material may comprise TiN, TiC, HfN, TaN, TaC, TaN, W, Al, Ru, RuTa, TaSiN, NiSix, CoSix, TiSi$_x$, Ir, Y, Pt, I, Pt, Ti, Pd, Re, Rh, borides of Ti, borides of Hf, borides of Zr, phosphides of Ti, phosphide of Hf, phoshides of Zr, antimonides of Ti, antimonides of Hf, antimonides of Zr, TiAlN, Mo, MoN, ZrSiN, ZrN, HfN, HfSiN, WN, Ni, Pr, VN, TiW, and/or combinations thereof.

In one or more embodiments, the charge storage layer 230 may serve as a charge trapping layer for a charge trapping memory device. Hence, the charge storage layer 230 may include any material that can serve as a charge trapping layer for a charge trapping memory device. Examples of charge trapping materials include, without limitation, nitrides (such as silicon nitride), nanocrystalline materials and, possibly, certain high-k materials. In one or more embodiments, the charge trapping layer may comprise a dielectric material.

Referring again to FIG. 1, after the formation of the charge storage layer 230, a second dielectric layer 240 may be formed over the charge storage layer 230. In one or more embodiments, the second dielectric layer 240 may be formed by a deposition process. In one or more embodiments, the second dielectric layer 240 may be formed by a growth process. In one or more embodiments, the second dielectric layer 240 may comprise an oxide (such as silicon dioxide $SiO_2$), a nitride (such as $Si_3N_4$ or $Si_xN_y$) an oxynitride (such as silicon oxynitride, S—O—N or $SiO_xN_y$), or combinations thereof. In one or more embodiments, the second dielectric layer 240 may comprise a stack of two or more layers (or a stack of three or more layers) such as an oxide/nitride stack such as a $SiO_2$/$Si_3N_4$ or an $SiO_2$/$Si_xN_y$ stack or a nitride/oxide stack, an oxide/nitride/oxide stack (for example, an ONO stack) or combinations thereof.

In one or more embodiments, the second dielectric layer 240 may comprise a high-k dielectric material. The high-k material may have a dielectric constant greater than 3.9. The high-k material may have a dielectric constant greater than silicon dioxide. The high-k material may comprise a hafnium-based material. The high-k material may comprise one or more of the elements Hf, Al, Si, Zr, O, N, Ta, La, Ti, Y, Pr, Gd and combinations thereof. The high-k material may comprise HfSiON, HfSiO, $HfO_2$, $HfSiO_x$, $HfAlO_x$, $HfAlO_xN_y$, $HfSiAO_x$, $HfSiAlO_xN_y$, $Al_2O_3$, $ZrO_2$, $ZrSiO_x$, $Ta_2O_5$, $SrTiO_3$, $La_2O_3$, $Y_2O_3$, $Gd_2O_3$, $Pr_2O_3$, $TiO_2$, $ZrAlO_x$, $ZrAlO_xN_y$, $SiAlO_x$, $SiAlO_xN_y$, $ZrSiAlO_x$, $ZrSiAlO_xN_y$, or combinations thereof. The high-k material may comprise $Al_2O_3$. Alternatively, the second dielectric layer 240 may comprise any other dielectric material or high-k dielectric material.

In one or more embodiments, the second dielectric layer 240 may have a thickness of at least 4 nm (nanometers). In one or more embodiments, the second dielectric layer may have a thickness of at least 6 nm. In one or more embodiments, the second dielectric layer may have a thickness of at least 8 nm. In one or more embodiment, the second dielectric layer 240 may have a thickness of less than about 20 nm. In one or more embodiments, the second dielectric layer 240 may have a thickness of less than about 15 nm. Other thicknesses are also possible. In one or more embodiments, the second dielectric layer 240 may comprise a single layer of material or it may comprise two or more layers of material.

The second dielectric layer 240 may be formed in many different ways. In one or more embodiments, the second dielectric layer 240 may be formed by deposition process. In one or more embodiments, the second dielectric layer 240 may be formed by a growth process (such as a thermal growth process). For example, the second dielectric layer may be grown by a thermal oxidation, deposited by a chemical vapor deposition (CVD), atomic layer deposition (ALD), physical vapor deposition (PVD), or a jet vapor deposition. Hence, the second dielectric layer may, for example, be formed by a growth process or by a deposition process.

As noted above, a high-k material may be formed, for example, by a deposition process. Examples of deposition process which may be used include chemical vapor deposition (CVD), physical vapor deposition (PVD), atomic layer deposition (ALD), molecular beam epitaxy (MDE), or other deposition processes.

In one or more embodiments, the second dielectric layer 240 may serve as an inter-gate dielectric layer between a floating gate and a control gate of a floating gate memory device. In one or more embodiments, the floating gate and the control gate may both be formed of a polysilicon material. The polysilicon material may be a polysilicon such as a doped polysilicon. The doped polysilicon may be n-doped or p-doped. In this case, the second dielectric layer 240 may serve as an interpoly dielectric material.

It is noted that the use of a high-k material as an inter-gate dielectric layer (or as an interpoly dielectric layer) in a floating gate memory device may be beneficial since the larger dielectric constant may lead to larger capacitive coupling. This may lead to a reduction in the power needed to operate the device.

Next, a control gate layer 250 may be formed over the second dielectric layer 240. The control gate layer 250 may be an upper gate layer. In one or more embodiments, the control gate layer 250 may be formed of any conductive material. Hence, in one or more embodiments, the control gate layer 250 may comprise any conductive material.

In one or more embodiments, the control gate layer 250 may comprise, for example, a polysilicon material. The polysilicon material may be polysilicon. The polysilicon may be doped with an n-type dopant (such as phosphorus) or a p-type dopant (such as boron). The doping may be accomplished using an ion implantation process. In one or more embodiments, it is conceivable that the doping may be done in-situ. In one or more embodiments, doping may be at least partially accomplished after the formation of the gate stack as explained below. In one or more embodiments, doping of the control gate layer 250 may be at least partially accomplished during the formation of the extension regions and/or the source/drain regions.

In one or more embodiments, the control gate layer 250 may comprise a metallic material such as a pure metal or a metal alloy. In one or more embodiments, the control gate layer 250 may be any other material suitable as a control gate for a charge storage memory device. In one or more embodiments, the control gate layer 250 may comprise a metal silicide or a metal nitride. In one or more embodiments, the control gate layer 250 may comprise TiN, TiC, HfN, TaN, TaC, TaN, W, Al, Ru, RuTa, TaSiN, NiSix, CoSix, TiSi$_x$, Ir, Y, Pt, I, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof.

The control gate layer 250 may comprise a single layer or a plurality of stacked layers (such as a polysilicon layer disposed over a metal layer). The control gate layer 250 may comprise a mixture (such as a heterogeneous mixture) of two or more different materials. In one or more embodiments, the thickness of the control gate layer 250 may be about 30 nanometer to about 300 nanometer, however, other thicknesses are also possible. The control gate layer 250 may be deposited in many different ways. Examples, include chemical vapor deposition, physical vapor deposition and atomic layer deposition.

Figure 2:
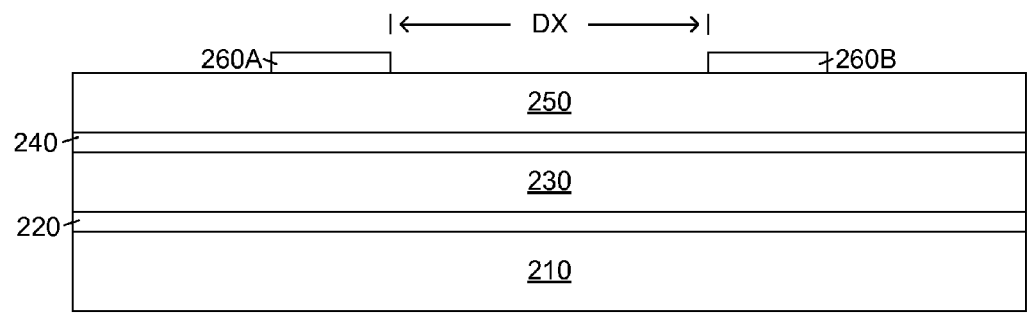

Still referring to FIG. 1, a masking layer 260 may be formed over the control gate layer 250. The masking layer 260 may comprise a photoresist material. Referring to FIG. 2, the masking layer 260 is patterned to form a first masking portion 260A and a second masking portion 260B. The first and second masking portions 260A, 260B are separated by a lateral distance DX.

Figure 3:
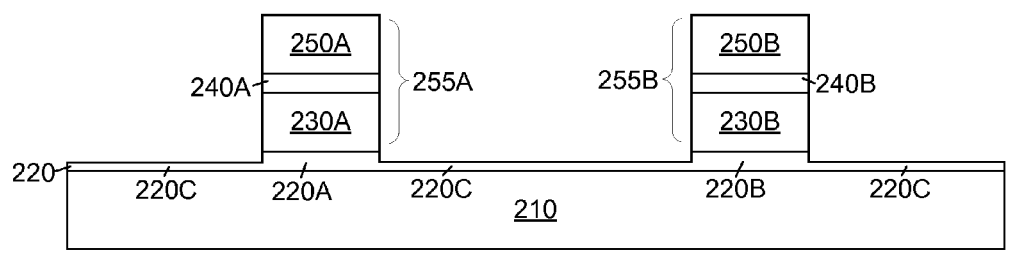

In a subsequent processing step, the layers 230, 240 and 250 may be masked and etched to form the gate stack 255A and the gate stack 255B shown in FIG. 3. The gate stack 255A comprises a charge storage layer 230A which is a portion of the charge storage layer 230 from FIG. 1, a second dielectric layer 240A which is a portion of second dielectric layer 240 from FIG. 1 and a control gate layer 250A which is a portion of control gate layer 250 from FIG. 1.

The gate stack 255B comprises a charge storage layer 230B which is a portion of the charge storage layer 230 from FIG. 1, a second dielectric layer 240B which is a portion of second dielectric layer 240 from FIG. 1 and a control gate layer 250B which is a portion of control gate layer 250 from FIG. 1.

In one or more embodiments, the charge storage layers 230A,B may be floating gate layers for floating gate memory devices. Each of the floating gate layers 230A,B may also be referred to as a floating gate. In one or more embodiments, each of the charge storage layers 230A,B may be a charge trapping layer for charge trapping memory devices. The control gate layers 250A,B may also be referred to as control gates for the charge storage memory device.

It is noted that the etch process to form each of the gate stacks 255A,B may take one or two or more etching steps. In one or more embodiments, at least one etch chemistry may be involved. In one or more embodiments, at least two etch chemistries may be involved.

Referring to FIG. 3, in one or more embodiments, the etch process to form the gate stacks 255A,B may stop on or within the first dielectric layer 220. Referring to the embodiment shown in FIG. 3, a portion 220C of the first dielectric layer 220 not underlying the gate stacks 255A,B may be partially etched. In another embodiment, it is possible that the portion 220C is not substantially etched. In another embodiment, it is possible that the portion 220C is etched all the way through.

A portion 220A of first dielectric layer 220 which underlies the gate stack 255A may not be substantially etched. The portion 220A of the first dielectric layer 220 may be referred to as first dielectric layer 220A. The first dielectric layer 220A underlying the gate stack 255A may serve as a tunneling dielectric for a charge storage device. The charge storage device may be either a floating gate device or a charge trapping device.

A portion 220B of dielectric layer 220 which underlies the gate stack 255B may not be substantially etched. The portion 220B of the first dielectric layer 220 may be referred to as first dielectric layer 220B. The first dielectric layer 220B underlying the gate stack 255B may serve as a tunneling dielectric for a charge storage device. The charge storage device may be either a floating gate device or a charge trapping device.

Figure 4:
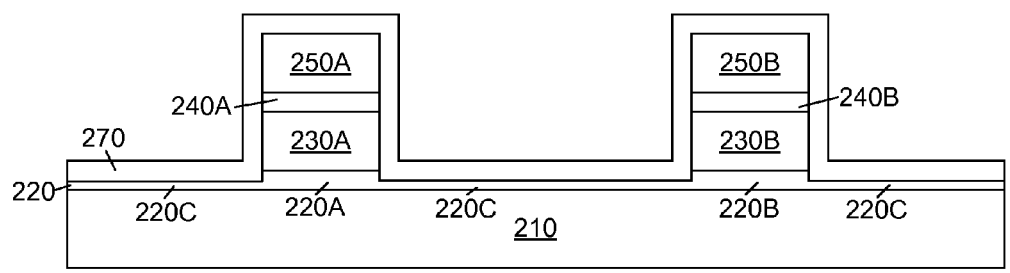

In a subsequent processing step, a dielectric layer 270 may be formed over the structure shown in FIG. 3 to form the structure shown in FIG. 4. The dielectric layer 270 may be formed by either a growth process or by a deposition process. The deposition process may comprise a substantially conformal deposition process. The dielectric layer 270 may be formed on the top and sidewall surface(s) of each of the gate stacks 255A,B as well as over the exposed portions of the first dielectric layer 220. The dielectric layer may be formed over the sidewall surfaces of the layers 230A, 240A and 250A of gate stack 255A as well as over the sidewall surfaces of the layers 230B, 240B and 250B of gate stack 255B. When a growth process is used, it is possible that the dielectric layer 270 may not substantially grow on the sidewall surfaces of the second dielectric layers 240A,B.

Generally, the dielectric layer 270 may comprise any dielectric material. In one or more embodiments, the dielectric layer 270 may comprise an oxide (such as silicon dioxide $SiO_2$), a nitride (such as $Si_3N_4$ or $Si_xN_y$) an oxynitride (such as silicon oxynitride, S—O—N or $SiO_xN_y$), or combinations thereof. In one or more embodiments, the dielectric layer 270 may comprise a stack of two or more layers (or a stack of three or more layers) such as an oxide/nitride stack such as a $SiO_2/Si_3N_4$ or an $SiO_2/Si_xN_y$ stack or a nitride/oxide stack, an oxide/nitride/oxide stack (for example, an ONO stack) or combinations thereof. In one or more embodiments, the dielectric layer 270 may comprise a high-k dielectric material.

Figure 5A:
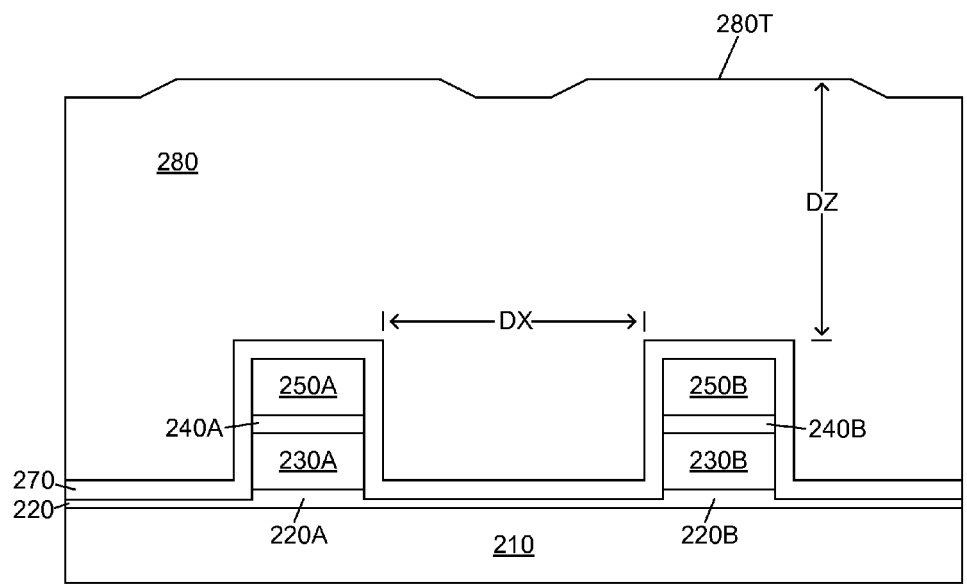

Referring now to FIG. 5A, a select gate layer 280 is formed over the structure shown in FIG. 4 to form the structure shown in FIG. 5A. The select gate layer has a top surface 280T. Referring to FIG. 5A, it is seen that the select gate layer 280 is formed over the dielectric layer 270. The select gate layer 280 may be formed over the gate stacks 255A,B as well as between the gate stacks 255A,B. In one or more embodiments, the select gate layer 280 may substantially fill the space between the gate stacks 255A,B. The select gate layer 280 may be formed by a growth process or by a deposition process. In one or more embodiments, the deposition process may be a substantially conformal deposition process.

In one or more embodiments, the select gate layer 280 may have a thickness of about 100 nm (nanometers) or greater. In one or more embodiments, the select gate layer 280 may have a thickness of about 200 nm or greater. In one or more embodiments, the select gate layer 280 may have a thickness of about 300 nm or greater. In one or more embodiments, the select gate layer 280 may have a thickness of about 400 nm or greater. In one or more embodiments, the select gate layer 280 may have a thickness of about 500 nm or greater.

In one or more embodiments, the select gate layer 280 may comprise or consist essentially of a polysilicon material. The polysilicon material may be polysilicon. The polysilicon may be doped with an n-type dopant (such as phosphorus) or a p-type dopant (such as boron). The doping may be accomplished using an ion implantation process or be done in-situ. In one or more embodiments, doping of the select gate layer may be at least partially accomplished during the formation of the extension regions and/or the source/drain regions. The formation of the extension regions and the source/drain regions is explained below.

Figure 6:
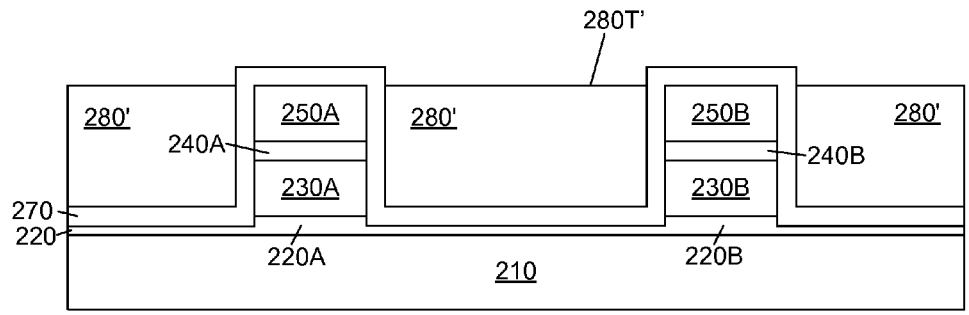
Figure 9:
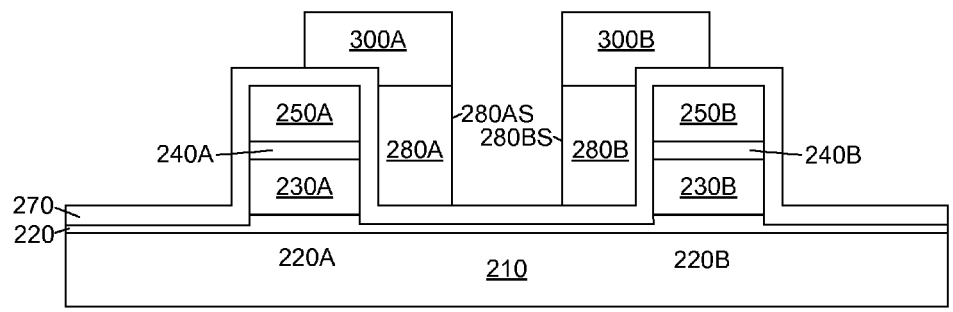

In one or more embodiments, the select gate layer may be doped after the formation of the select gate layer 280' (as shown in FIG. 6) and/or after the formation of the select gate layers 280A,B (as shown in FIG. 9).

In one or more embodiments, the select gate layer may be formed of any other conductive material. In one or more embodiments, the select gate layer 280 may comprise a metallic material such as a pure metal or a metal alloy. In one or more embodiments, the select gate layer 280 may be any other material suitable as a select gate for a charge storage memory device. In one or more embodiments, the select gate layer 280 may comprise a metal silicide or a metal nitride. In one or more embodiments, the select gate layer 280 may comprise TiN, TiC, HfN, TaN, TaC, TaN, W, Al, Ru, RuTa, TaSiN, NiSix, CoSix, $TiSi_x$, Ir, Y, Pt, I, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof.

The select gate layer 280 may have a vertical dimension DZ above the gates stacks 255A, 255B. In one or more embodiments, the dimension DZ may be a maximum dimension as measured from a surface which is level with the top surface of dielectric layer 270 to the top surface 280T of the select gate layer 280.

The dimension DX may be a lateral dimension between the gate stacks 255A, 255B. In one or more embodiments, the dimension DX may be a lateral dimension between a portion of the layer 270 overlying the first gate stack 255A and a portion of the dielectric layer 270 overlying the second gate stack 255B.

In one or more embodiments, the vertical distance DZ may be chosen so as to create a substantially flat top surface 280T of the select gate layer 280. In one or more embodiments, the vertical distance DZ may be chosen to be substantially equal to or greater than the lateral distance DX. That is, in one or more embodiments, $DZ \geq DX$. In one or more embodiments, $DZ \geq (1.5)DX$. In one or more embodiments, $DZ \geq (2)DX$. It is noted that the top surface 280T may become smoother and smoother as the distance DZ is increased.

Figure 5B:
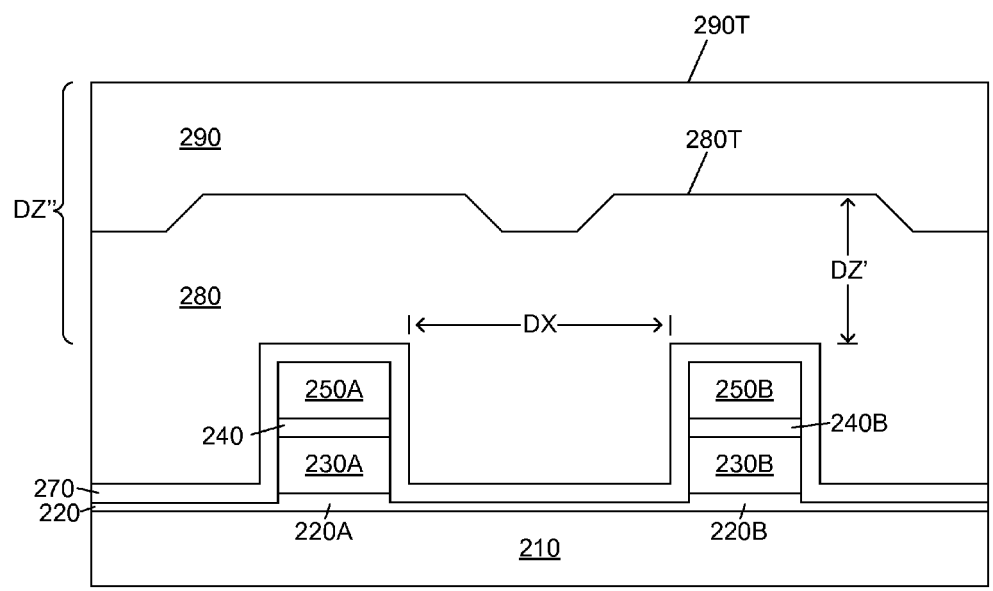

FIG. 5B shows another embodiment of the invention. Referring to FIG. 5B, it is seen that an additional (and optional) smoothing layer 290 may be formed over the select gate layer 280. In one or more embodiments, the smoothing layer may be formed by either a growth process or by a deposition process. In one or more embodiments, the smoothing layer may be formed by a chemical vapor deposition process. In one or more embodiments, the smoothing layer may be formed by a spin-on process.

In one or more embodiments, the smoothing layer 290 may comprise a photoresist material. In one or more embodiments, the smoothing layer 290 may comprise an anti-reflective coating material (for example, an ARC material). In one or more embodiments, the smoothing layer 290 may comprise a gap fill material.

In one or more embodiments, the smoothing layer 290 may comprise a low-k dielectric material. In one or more embodiments, the dielectric constant of the material may be lower than that of silicon dioxide.

In one or more embodiments, the low-k dielectric material may be deposited by a chemical vapor deposition technique. In one or more embodiments, the low-k dielectric material may be an oxide deposited by a chemical vapor deposition technique. In one or more embodiments, the low-k dielectric material may be deposited by a spin-on technique.

In one or more embodiments, the low-k dielectric may be a porous low-k dielectric. For example, the smoothing layer 290 may comprise a porous low-k oxide. The porous low-k dielectric (such as the low-k oxide) may be deposited by a chemical vapor deposition process.

In one or more embodiments, the smoothing layer 290 may comprise a polymeric dielectric material.

In one or more embodiments, the smoothing layer 290 may comprise an organic material. In one or more embodiments, the organic material may be an organic low-k dielectric material. In one or more embodiments, the organic material may, for example, comprise a spin-on organic polymeric dielectric.

In one or more embodiments, the smoothing layer 290 may comprise a spin-on polymeric dielectric such as SiLK. In one or more embodiments, the spin-on polymeric dielectric may be a spin-on organic polymeric dielectric.

In one or more embodiments, the smoothing layer 290 may comprise a doped silicon dioxide. The doped silicon dioxide may be non-porous or porous.

In one or more embodiments, the smoothing layer 290 may comprise a carbon doped dielectric material such as a carbon doped silicon dioxide. The carbon doped silicon dioxide material may be non-porous or porous. An example of a carbon doped silicon dioxide may be BLACK DIAMOND from Applied Materials, Inc. of Santa Clara, Calif.

In one or more embodiments, the smoothing layer 290 may be different from the select gate layer 280. In one or more embodiments, the smoothing layer 290 may comprise a material which is different from the select gate layer 280.

As shown in FIG. 5B, the smoothing layer 290 may function to smooth the variations in the top surface 280T of the select gate layer 280. Hence, it is thus possible that the select gate layer 280 may be formed so that the distance DZ' of the select gate layer 280 shown in FIG. 5B (which is used in combination with a smoothing layer 290) is less than the distance DZ of the select gate layer 280 shown in FIG. 5A (which is used without a smoothing layer 290).

The combination of the select gate layer 280 and the smoothing layer 290 may have a vertical dimension DZ" above the top of the gate stacks 255A,B as shown in FIG. 5B. In one or more embodiments, the dimension DZ" may be a maximum dimension as measured from the dielectric layer 270 to the top surface 290T of the smoothing layer 290.

In one or more embodiments, the vertical distance DZ" may be chosen to be substantially equal to or greater than the lateral distance DX. That is, in one more embodiments, $DZ'' \geq DX$. In one or more embodiments, $DZ'' \geq (1.5)DX$. In one or more embodiments, $DZ'' \geq (2)DX$. It is noted that the top surface 280T may become smoother and smoother as the distance DZ" is increased.

In one or more embodiments, it is possible that the distances DX, DZ, DZ' and DZ" may instead be measured from the surfaces of the gate stacks 255A,B. For example, in one or more embodiments, the layer 270 may not be used. In this case, it is possible that the distances DX, DZ, DZ' and DZ" may instead be measured from the surfaces of the gate stacks 255A,B.

Referring to FIG. 6, the select gate layer 280 shown in FIG. 5A, or the combination of select gate layer 280 and smoothing layer 290 shown in FIG. 5B, may be etched back to the select gate layer 280' shown in FIG. 6. The select gate layer 280' is a portion of the select gate layer 280 shown in FIG. 5A or FIG. 5B. In one or more embodiments, the select gate layer 280' shown in FIG. 6 may exhibit a local planarization. In one or more embodiments, the local planarization may exist at least between the gate stacks 255A,B and/or proximate to the gate stacks 255A,B (on one or both sides of the gate stacks 255A,B). Referring to FIG. 6, the select gate layer 280' has a top surface 280T'.

In one or more embodiments, the etching process may comprise a dry etching process. In one or more embodiments, the dry etching process may comprise a plasma etching process. In one or more embodiments, the dry etching process may comprise a reactive ion etch (RIE). In one or more embodiments, the reaction ion etch (RIE) may include both a reactive chemical process and a physical process using ion bombardment. In one or more embodiments, the dry etching process may comprise an isotropic etch. In one or more embodiments, the dry etching process may comprise an anisotropic etch. In one or more embodiments, the etching process may include one or more (and possibly two or more) etch chemistries. In one or more embodiments, the etch process used to etch the relatively thick select gate layer 280 (with or without the smoothing layer 290) may be performed without a masking step.

In one or more embodiments, the etching process to etch the select gate layer 280 shown in FIG. 5A, or the select gate layer 280 in combination with the smoothing layer 290 shown in FIG. 5B, may comprise a wet etching process. In one or more embodiments, the wet etching process may be an isotropic etching process. In one or more embodiments, the etchant used for the wet etching process may comprise potassium hydroxide (KOH).

In one or more embodiments, the etching process to etch the select gate layer 280, or the select gate layer 280 in combination with the smoothing layer 290, may comprise an isotropic etching process.

In one or more embodiments, the etching process to etch the select gate layer 280, or the select gate layer 280 in combination with the smoothing layer 290, may comprise an anisotropic etching process.

The process of depositing a relatively thick select gate layer 280 (as shown, for example, in FIGS. 5A,B without or with an additional smoothing layer 290) and then etching back to a thinner select gate layer 280' (as shown, for example, in FIG. 6) may be viewed as an example of an etchback process.

In one or more embodiments, the etching process may serve to provide a smoothing or planarization affect in that the top surface 280T' shown in FIG. 6 may be smoother that the top surface 280T shown in FIG. 5A (or the top surface 290T shown in FIG. 5B). In one or more embodiments, the smoothing or planarization may be a local smoothing or local planarization.

The select gate layer 280 shown in either FIG. 5A or 5B may be etched back to the select gate layer 280' shown in FIG. 6. The select gate layer 280' shown in FIG. 6 has a top surface 280T' which may be at or below the top surface of dielectric layer 270. The etching process may use the dielectric layer 270 as an etch-stop layer.

The select gate layer 280, shown in FIG. 5A or FIG. 5B, may be etched by timed or endpointed RIE etch where the endpoint may be found when the etch (which may, for example, be a polysilicon etch) reaches the dielectric layer 270 which covers the gate stacks 255A,B.

As noted, the etching process may be used to etch the structure shown in FIG. 5A (without an additional smoothing layer) or it may be used to etch the structure shown in FIG. 5B (with at least one additional smoothing layer 290).

The use of an etching process to remove a portion of the select gate layer 280 shown in FIG. 5A or FIG. 5B so as to create select gate layer 280' as shown in FIG. 6 may have one or more advantages over the use of a chemical mechanical polishing (CMP) process. The etching process may be simpler and more cost effective to perform.

In one or more embodiments, the top surface 280T' of the select gate layer 280' shown in FIG. 6 may be such that it retains some of the topology of the top surface 280T of the select gate layer 280 (as shown in FIG. 5A) or some of the topology of the top surface 290T of the smoothing layer 290 (as shown in FIG. 5B).

Figure 7:
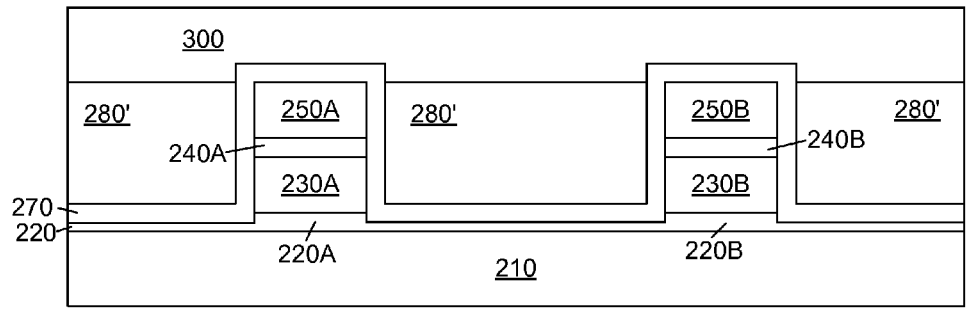
Figure 8:
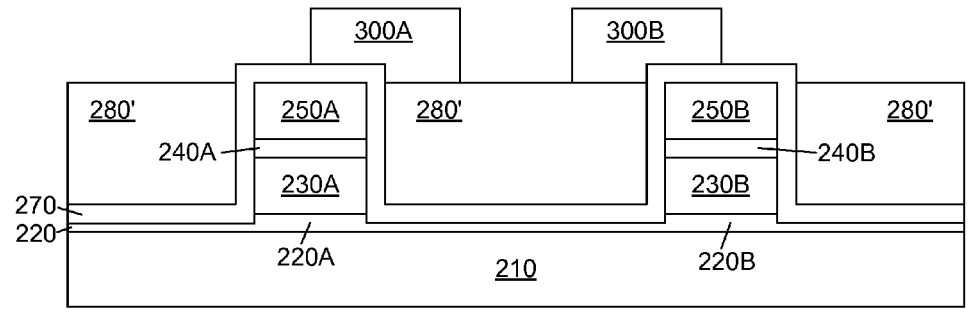

Referring to FIG. 7, a masking layer 300 may be formed over the structure shown in FIG. 6 to form the structure shown in FIG. 7. The masking layer 300 may comprise a photoresist material. Referring to FIG. 8, the masking layer 300 is patterned to form a first masking portion 300A and a second masking portion 300B. The first masking portion 300A may overlie at least a portion of the first gate stack 255A and a portion of the select gate layer 280' which is between the first and second gate stacks 255A,B. The second masking portion 300B may overlie at least a portion of the second gate stack 255B and a portion of the select gate layer 280' which is between the first and second gate stacks 255A,B.

Referring to FIG. 9, the first masking portion 300A and the second masking portion 300B are each used as a mask to etch the select gate layer 280' from FIG. 8 in order to form the first select gate layer 280A and the second select gate layer 280B shown in FIG. 9. The first select gate layer 280A may also be referred to as first select gate 280A. The second select gate layer 280B may also be referred to as second select gate 280B.

The etching process used to form the first select gate 280A and the second select gate 280B may be a dry etch process. The dry etch process may comprise a plasma etch. The etching process used may be a reactive ion etch (RIE). The etching process may comprise an anisotropic etching process.

In one or more embodiments, the first select gate 280A and the second select gate 280B may each be in the shape of a block. In one or more embodiments, the first select gate 280A and the second select gate 280B may each have a substantially rectangular shape. In one or more embodiments, the first and second select gates 280A,B may each have substantially vertical sidewalls 280AS,BS (or substantially vertical gate thicknesses).

While not wishing to be bound by theory, the shape of the select gates 280A,B, may play a role in determining the electrical characteristics of the select gates. If the select gates are quasi-triangular in shape it is possible that the outer edge of the underlying dielectric (for example, oxide) layer 270 between the first and second select gates 280A,B are not protected with respect to the extension and source/drain implants. This may give rise to reliability issues. It may thus be useful that the outer sidewall of the select gate (e.g. the sidewall remote to the gate stack), may comprise some vertical component in order for the select gates to protect the underlying dielectric (for example, oxide) from the effects of unintentional implantation. Such a vertical component may additionally allow formation of an implant protecting spacer (for example, a dielectric spacer) later in the process.

In one or more embodiments, the shape of the select gates 280A,B may be such that their top surfaces retain some of the topology of the top surface 280T of the select gate layer 280 (as shown in FIG. 5A) or some of the topology of the top surface 290T of the smoothing layer 290 (as shown in FIG. 5B).

In one or more embodiments, the select gates 280A,B may, or example, comprise a polysilicon material such as polysilicon. The polysilicon may be a doped polysilicon. In one or more embodiments, the select gates 280A,B may comprise n-doped polysilicon. In one or more embodiments, the select gates 280A,B may comprise p-doped polysilicon. The doping may be performed by an implantation process (such as ion implantation) or it may be performed by an in-situ process. In one or more embodiments, the doping may be performed during the formation of the extension regions and/or the source/drain regions (explained below).

The resulting structure shown in FIG. 9 includes a first select gate 280A and a second select gate 280B. The first select gate 280A may be associated with the first control gate 250A and the first charge storage layer 230A. The first select gate 280A may be proximate to the first gate stack 255A and remote to the second gate stack 255B. The first select gate 280A may be disposed lateral to the sidewall of the first gate stack 255A. The first select gate 280A may be adjacent to a portion of dielectric layer 270 that is along a sidewall of the first gate stack 255A.

The second select gate 280B may be associated with the second control gate 250B and the second charge storage layer 230B. The second select gate 280B may be proximate to the second gate stack 255B and remote to the first gate stack 255A. The second select gate 280B may be disposed lateral to the sidewall of the second gate stack 255B. The second select gate 280B may be adjacent to a portion of dielectric layer 270 that is along a sidewall of the second gate stack 255B.

Figure 10:
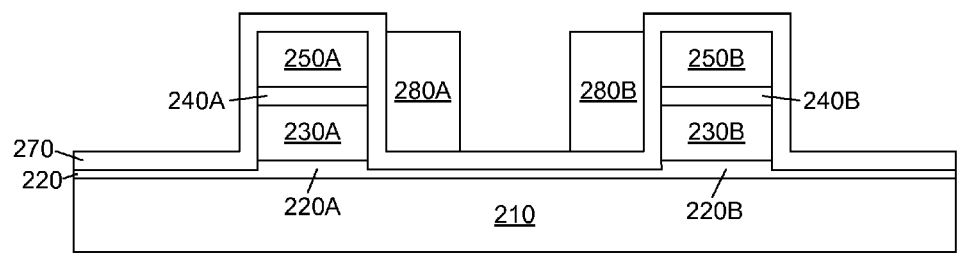

Referring to FIG. 10, after the formation of the first select gate 280A and the second select gate 280B, the first mask portion 300A and the second mask portion 300B may be removed.

Figure 11:
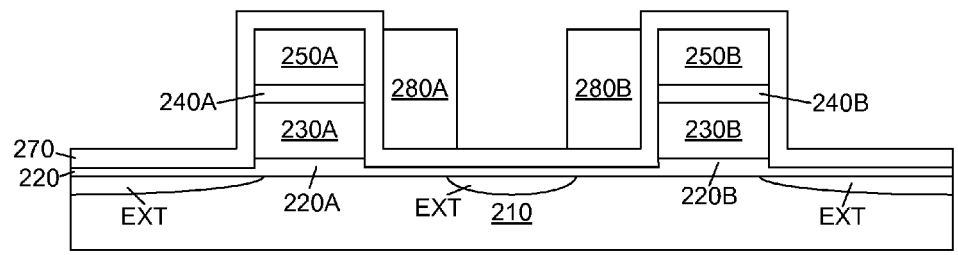

Referring to FIG. 11, the structure shown in FIG. 10 may then be ion implanted to form the extension regions EXT shown in FIG. 11. Referring to FIG. 11, in one or more embodiments, the extension regions EXT may, for example, be lightly doped drain (LDD) regions. In one or more embodiments, the extension regions EXT may, for example, be medium doped drain (MDD) regions. In one or more embodiments, the extension regions EXT may be n-type. In one or more embodiments, the extension regions EXT may be p-type.

In one or more embodiments, the doping of the extension regions EXT may also serve to dope the select gates 280A,B and/or the control gates 250A,B.

Figure 12:
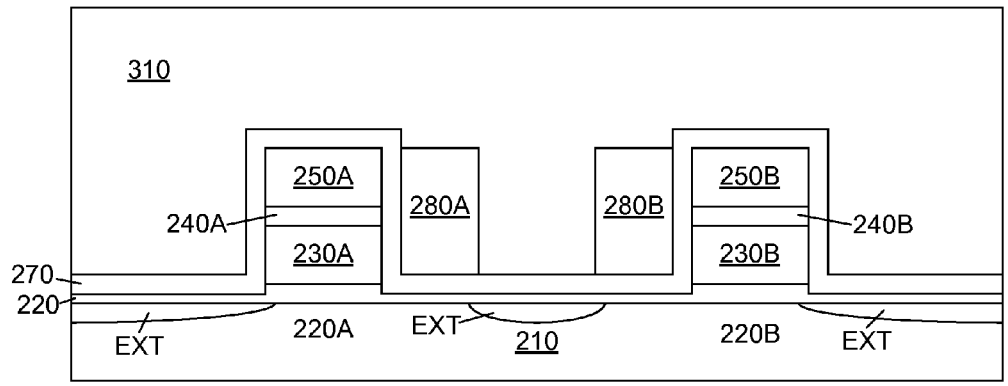

Referring to FIG. 12, a dielectric layer 310 may then formed over the structure shown in FIG. 11 to form the structure shown in FIG. 12. The dielectric layer 310 may be formed over the select gates 280A,B as well as over gate stacks 255A,B. The dielectric layer 310 may be formed over the layer 270. The dielectric layer 310 may be formed by either a deposition process or a growth process. The deposition process may comprise a substantially conformal deposition process. The dielectric layer 310 may comprise any dielectric material. Examples of dielectric materials include, but not limited to, oxides, nitrides, oxynitrides and mixtures thereof. The dielectric material may comprise a high-k material.

Figure 13:
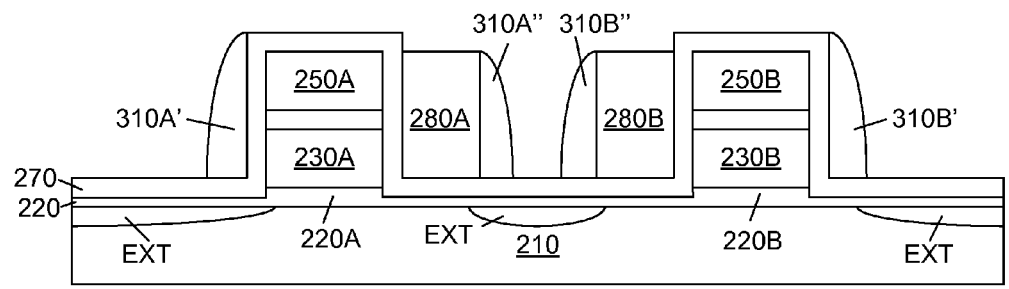

Referring to FIG. 13, the dielectric layer 310 shown in FIG. 12 may then be etched to form the structure shown in FIG. 13. The etching process may comprise a dry etching process. For example, the etching process may comprise a plasma etching process. The etching process may comprise a reactive ion etc. The etching process may comprise an anisotropic etch.

As a result of the etch, sidewall spacers 310A', 310A", 310B', 310B" may be formed. A sidewall spacer 310A' may be formed over a sidewall of dielectric layer 270. The sidewall spacer 310A' may be formed over a portion of dielectric layer 270 which overlies a sidewall of first gate stack 255A. The sidewall spacer 310A' may be adjacent and lateral to a portion of the dielectric layer 270 which overlies a sidewall of the first gate stack 255A. Likewise, a sidewall spacer 310A" may be formed over a sidewall of the first select gate 280A. The sidewall spacer 310A" may be adjacent and lateral to the first select gate 280A.

A sidewall spacer 310B' may be formed over a sidewall of dielectric layer 270. The sidewall spacer 310B' may be formed over a portion of dielectric layer 270 which overlies a sidewall of second gate stack 255B. The sidewall spacer 310B' may be adjacent and lateral to a portion of the dielectric layer 270 which overlies the second gate stack 255B. Likewise, a sidewall spacer 310B" may be formed over a sidewall of the second select gate 280B. The sidewall spacer 310B" may be adjacent and lateral to the second select gate 280B.

Figure 14:
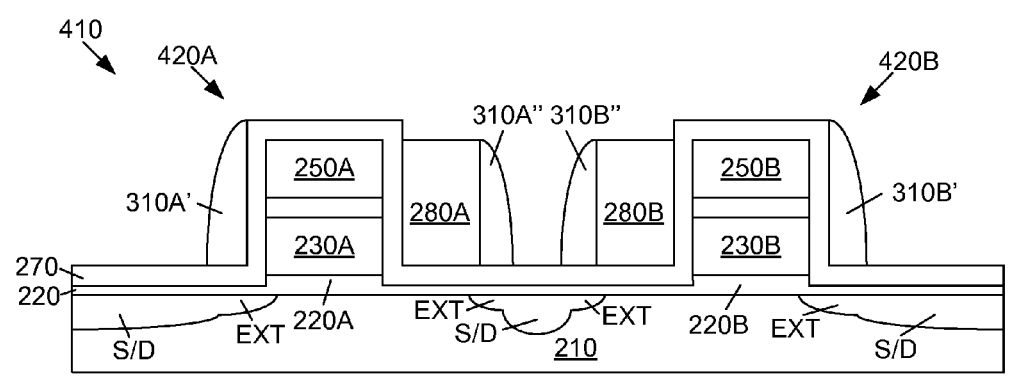

After the formation of the sidewall spacers 310A' and 310A" as well as the sidewall spacers 310B' and 310B", the structure shown in FIG. 13 may be ion implanted to form the source/drain regions S/D that are shown in FIG. 14. In one or more embodiments, the source/drain regions S/D may be formed as heavily doped drain (HDD) regions. The dopant type of the source/drain regions S/D may be the same as the dopant type of the extension regions EXT. The dopant concentration of the source/drain regions EXT may be greater than the dopant concentration of the extension regions EXT.

The depth of the source/drain regions S/D may be greater than the depth of the extension region EXT.

In one or more embodiments, the ion implantation step used to form the extension regions EXT may also serve to dope the control gates 250A,B and/or the select gates 280A,B with either n-type or p-type dopants. Likewise, in one or more embodiments, the ion implantation step used to form the source/drain regions S/D may be used to dope the control gates 250A,B and/or the select gates 280A,B with n-type or p-type dopants.

FIG. 14 shows a semiconductor structure 410 that includes a first memory device 420A and a second memory device 420B. The semiconductor structure 410 may, for example, be a semiconductor chip. The semiconductor chip may, for example, include an integrated circuit. One or both of the memory devices 420A,B may be part of the integrated circuit. The semiconductor structure 410 may, for example, be a semiconductor device.

The memory device 420A includes a charge storage layer 230A, a control gate 250A and a select gate 280A. The memory device 420B includes a charge storage layer 230B, a control gate 250B and a select gate 280B. In one or more embodiments, one or both of the devices 420A,B may be useful as memory devices such as a charge storage memory devices.

The memory device 420A may further comprise first dielectric layer 220A and second dielectric layer 240A. The memory device 420B may further comprise first dielectric layer 220B and second dielectric layer 240B. In one or more embodiments, the charge storage memory devices 420A,B may be floating gate memory devices. In this case, the charge storage layers 230A,B may be floating gate layers. The floating gate layers may also be referred to as floating gates for the floating gate memory devices. In one or more embodiments, the floating gates 230A,B may be formed of a doped polysilicon or some other conductive material. The doped polysilicon may be n-type doped or p-type doped. In one or more embodiments, the control gates 250A,B may, for example, be formed of a doped polysilicon or some other conductive material. The doped polysilicon may be n-type doped or p-type doped. In one or more embodiments, the select gates 280A,B may be formed of a doped polysilicon or some other conductive material. The doped polysilicon may be n-type doped or p-type doped. The first dielectric layers 220A,B may, for example, comprise an oxide (such as silicon dioxide—which may, for example, be formed by a growth process), a nitride, an oxynitride, or combinations thereof. The second dielectric layers 240A,B may, for example, comprise an oxide, a nitride, an oxynitride, or combinations thereof. The second dielectric layer 240A,B may comprise a high-k material. In one or more embodiments, the second dielectric layers 240A,B may comprise an oxide-nitride-oxide stack. Of course, the materials mentioned for a floating gate device are only examples and other materials may be substituted for the materials described.

In one or more embodiments, the floating gate devices may possibly be programmed by Fowler-Nordheim tunneling or by hot-carrier injection. In one or more embodiments, erasure may possibly be accomplished by UV emission or by Fowler-Nordheim tunneling. In one or more embodiments, it is possible that electrical charge may be stored on the floating gate so as to adjust the threshold voltage $V_T$ of the device. Of course, these are only examples of possible ways to operate a floating gate device and other ways may also be possible.

In one or more embodiments, the charge storage memory devices 420A,B may be charge trapping memory devices. In this case, the charge storage layers 230A,B may be charge trapping layers. The charge trapping layers may, for example, comprise a nitride (such as silicon nitride), an oxynitride, a nanocrystalline material or a high-k material. In one or more embodiments, the charge storage layers 230A,B may comprise a dielectric material. The first dielectric layers 220A,B may, for example, comprise an oxide (such as a silicon dioxide). The oxide may, for example, be formed by a growth process. The second dielectric layers 240A,B may, for example, comprise an oxide and/or a high-k material. The control gate 250A,B may, for example, be a polysilicon material such as a doped polysilicon. The select gates 280A,B may, or example, comprise a polysilicon material such as a doped polysilicon. In one or more embodiments, the select gates 280A,B may comprise n-doped polysilicon. In one or more embodiments, the select gates 280A,B may comprise p-doped polysilicon. The doping may be performed by an implantation process (such as ion implantation) or it may be performed by an in-situ process. Of course, the materials described for a charge trapping device are only examples and other materials may be substituted for the materials described.

In one or more embodiments, a charge trapping device may possibly be programmed by applying a sufficiently high positive voltage to the control gates 250A,B. This may lead to an electron tunneling current (for example, by Fowler-Nordheim tunneling) from the substrate 210 through the first dielectric layers 220A,B and toward the charge trapping layer 230A,B, where the electrons may be trapped. The trapped electrons may give rise to an increased threshold voltage $V_T$ which may indicate that the device is programmed. In one or more embodiments, a charge trapping device may possibly be erased by applying a suitable negative voltage to the control gate. In one or more embodiments, as another example, a charge trapping device may possibly be programmed by hot-carrier injection. Of course, these are only examples of possible ways to possibly operate a charge trapping device and other ways may also be possible.

In one or more embodiments, the charge storage memory devices 420A,B shown in FIG. 14 may be stand-alone memory devices. In one or more embodiments, the charge storage memory devices 420A,B, may be used as an embedded memory device in combination with at least one logic device on the same chip or the same substrate. Hence, the same chip (or same substrate) may include a memory portion (with one or more memory devices) and a logic portion (with one or more logic devices).

One or more embodiments may relate to a method of forming a semiconductor device, comprising: providing a substrate; forming a gate stack over the substrate, the gate stack including a control gate over a charge storage layer; forming a select gate layer over the gate stack; etching the select gate layer to remove a portion of the select gate layer and leave a remaining portion of the select gate layer; and forming a select gate, the forming the select gate comprising etching the remaining portion of the select gate layer.

One or more embodiments may relate to a method of forming a semiconductor device, comprising: providing a substrate; forming a first gate stack over the substrate, the first gate stack including a control gate over a charge storage layer; forming a second gate stack over the substrate, the second gate stack including a control gate over a charge storage layer; forming a select gate layer over the first gate stack and the second gate stack; etching the select gate layer to remove a portion of the select gate layer and leave a remaining portion of the select gate layer; and forming a first select gate proximate the first gate stack and a second select gate proximate the second gate stack, the forming comprising etching the remaining portion of the select gate layer.

One or more embodiments may relate to a method of forming a semiconductor device, the semiconductor device including a control gate, a charge storage layer and a select gate, the method comprising: providing a substrate; forming a gate stack over the substrate, the gate stack including a control gate over a charge storage layer; forming a select gate layer over the gate stack; isotropically etching the select gate layer to remove a portion of the select gate layer and leave a remaining portion of the select gate layer; and anisotropically etching the remaining portion of the select gate layer.

One or more embodiments may relate to a method of forming a semiconductor device, the semiconductor device including a control gate, a charge storage layer and a select gate, the method comprising: providing a substrate; forming a gate stack over the substrate, the gate stack including the control gate over the charge storage layer; and forming the select gate lateral to a sidewall of the gate stack, the forming the gate stack comprising an etchback process.

In one or more embodiments, it is possible that one or more embodiments of the methods described herein may provide a more cost effective and/or more efficient means of making one or more semiconductor devices.

Although the invention has been described in terms of certain embodiments, it will be obvious to those skilled in the art that many alterations and modifications may be made without departing from the invention. Accordingly, it is intended that all such alterations and modifications be included within the spirit and scope of the invention.

What is claimed is:

1. A method of forming a semiconductor device, the method comprising:
    providing a substrate;
    forming a gate stack over said substrate, said gate stack including a control gate over a charge storage layer;
    forming a select gate layer over said gate stack;
    etching said select gate layer to remove a portion of said select gate layer and leave a remaining portion of said select gate layer; and
    forming a select gate, said forming said select gate comprising etching said remaining portion of said select gate layer.

2. The method of claim 1, further comprising forming a dielectric layer over said gate stack before forming said select gate layer over said gate stack.

3. The method of claim 2, further comprising, after forming said dielectric layer over said gate stack, forming a first dielectric spacer over said dielectric layer adjacent a sidewall of said gate stack and a second dielectric spacer over a sidewall of said select gate.

4. The method of claim 1, wherein said etching said select gate layer comprises a dry etch.

5. The method of claim 4, wherein said dry etch is an isotropic etch.

6. The method of claim 1, wherein said etching said select gate layer comprises a wet etch.

7. The method of claim 1, wherein said etching said remaining portion comprises a dry etch.

8. The method of claim 7, wherein said dry etch is an anisotropic etch.

9. The method of claim 1, wherein said charge storage layer is a floating gate or a charge trapping layer.

10. The method of claim 1, further comprising, after forming said select gate layer and before etching said select gate layer, forming a smoothing layer over said select gate layer; and
    said etching said select gate layer comprises etching said smoothing layer and said select gate layer.

11. The method of claim 10, wherein said etching said smoothing layer and said select gate layer comprises a dry etch.

12. The method of claim 11, wherein said dry etch is isotropic.

13. The method of claim 11, wherein said dry etch is anisotropic.

14. The method of claim 10, wherein said etching said smoothing layer and said select gate layer comprises a wet etch.

15. A method of forming a semiconductor device, the method comprising:
    providing a substrate;
    forming a first gate stack over said substrate, said first gate stack including a control gate over a charge storage layer;
    forming a second gate stack over said substrate, said second gate stack including a control gate over a charge storage layer;
    forming a select gate layer over said first gate stack and said second gate stack;
    etching said select gate layer to remove a portion of said select gate layer and leave a remaining portion of said select gate layer; and
    forming a first select gate proximate said first gate stack and a second select gate proximate said second gate stack, said forming comprising etching said remaining portion of said select gate layer.

16. The method of claim 15, further comprising forming a dielectric layer over said first gate stack and said second gate stack before forming said select gate layer over said gate stack.

17. The method of claim 16, further comprising, after forming said dielectric layer over said first gate stack and said second gate stack, forming a first dielectric spacer over said dielectric layer adjacent a sidewall of said first gate stack and a second dielectric spacer over a sidewall of said first select gate, and forming a first dielectric spacer over said dielectric layer adjacent a sidewall of said second gate stack and a second dielectric spacer over a sidewall of said second select gate.

18. The method of claim 15, wherein said etching said select gate layer comprises a dry etch.

19. The method of claim 18, wherein said dry etch is isotropic.

20. The method of claim 15, wherein said etching said select gate layer comprises a wet etch.

21. The method of claim 15, wherein said etching said remaining portion comprises a dry etch.

22. The method of claim 21, wherein said dry etch is anisotropic.

23. The method of claim 15, wherein said select gate layer comprises a polysilicon material.

24. The method of claim 15, wherein the height of the select gate layer above the dielectric layer is at least 1.5 times greater than distance between the dielectric layer overlying said first gate stack and said dielectric layer overlying said second gate stack.

25. The method of claim 15, further comprising, after forming said select gate layer and before etching said select gate layer, forming a smoothing layer over said select gate layer; and
    said etching said select gate layer comprises etching said smoothing layer and said select gate layer.

26. The method of claim 25, wherein said etching said smoothing layer and said select gate layer comprises a dry etch.

27. The method of claim 26, wherein said dry etch is isotropic.

28. The method of claim 26, wherein said dry etch is anisotropic.

29. The method of claim 25, wherein said etching said smoothing layer and said select gate layer comprises a wet etch.

30. A method of forming a semiconductor device, said semiconductor device including a control gate, a charge storage layer and a select gate, said method comprising:
   providing a substrate;
   forming a gate stack over said substrate, said gate stack including a control gate over a charge storage layer;
   forming a select gate layer over said gate stack;
   etching said select gate layer to remove a portion of said select gate layer and leave a remaining portion of said select gate layer; and
   etching said remaining portion of said select gate layer.

31. The method of claim 30, wherein said etching said select gate layer comprises a dry etch.

32. The method of claim 31, wherein said dry etch is isotropric.

33. The method of claim 31, wherein said dry etch is anisoptropic.

34. The method of claim 30, wherein said etching said select gate layer comprises a wet etch.

35. The method of claim 30, further comprising forming a dielectric layer over said gate stack before forming said select gate layer.

36. The method of claim 30, wherein said select gate layer comprises a polysilicon material.

37. The method of claim 30, further comprising, after forming said select gate layer and before etching said select gate layer, forming a smoothing layer over said select gate layer; and
   said etching said select gate layer comprises etching said smoothing layer and said select gate layer.

38. The method of claim 37, wherein etching said smoothing layer and said select gate layer comprises a dry etch.

39. The method of claim 38, wherein said dry etch is isotropic.

40. The method of claim 38, wherein said dry etch is anisotropic.

* * * * *